(12) United States Patent
Ooishi et al.

(10) Patent No.: US 6,621,306 B2
(45) Date of Patent: Sep. 16, 2003

(54) RANDOM LOGIC CIRCUIT

(75) Inventors: Tsukasa Ooishi, Tokyo (JP); Hideto Hidaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 59 days.

(21) Appl. No.: 10/036,406

(22) Filed: Jan. 7, 2002

(65) Prior Publication Data

US 2002/0057111 A1 May 16, 2002

Related U.S. Application Data

(63) Continuation of application No. 09/571,270, filed on May 15, 2000, now Pat. No. 6,337,583.

(30) Foreign Application Priority Data

May 17, 1999 (JP) .......................................... 11-135088

(51) Int. Cl.[7] .......................................... H03K 19/094
(52) U.S. Cl. ............................ 326/119; 326/28; 326/98
(58) Field of Search ................................. 326/112, 119, 326/121, 113, 26–28; 327/202, 203, 210, 211, 212

(56) References Cited

U.S. PATENT DOCUMENTS

| | | | |
|---|---|---|---|
| 5,376,848 A | 12/1994 | Hanke, III et al. | 326/95 |
| 5,612,632 A | 3/1997 | Mahant-Shetti et al. | 326/93 |
| 5,629,643 A | 5/1997 | Moughanni et al. | 327/199 |
| 6,208,170 B1 | 3/2001 | Iwaki et al. | 326/119 |

OTHER PUBLICATIONS

"1–V Power Supply High–Speed Digital Circuit Technology with Multithreshold–Voltage CMOS", S. Mutoh et al, IEEE Journal of Solid–State Circuits, vol. 30, No. *, Aug. 1995, pp. 847–854.

"A Swing Restored Pass–Transistor Logic–Based Multiply and Accumulate Circuit for Multimedia Applications", A. Parameswar et al, IEEE Journal of Solid–State Circuits, vol. 31, No. 6, Jun. 1996, pp. 804–809.

*Primary Examiner*—Don Le
(74) *Attorney, Agent, or Firm*—McDermott, Will & Emery

(57) ABSTRACT

A random logic circuit comprises an input portion for inputting data; a first latch portion for receiving the data outputted from the input portion, and holding and outputting the data; a second latch portion for receiving the data outputted from the first latch portion, and holding and outputting the data; an output portion for receiving the data outputted from the second latch portion and outputting the data to a logic circuit; and a prevention circuit for preventing generation of a sub-threshold leak current in sleep mode between the first latch portion and the second latch portion.

7 Claims, 10 Drawing Sheets

RANDOM LOGIC CIRCUIT

This application is a continuation of U.S. patent application Ser. No. 09/571,270, filed May 15, 2000 is now U.S. Pat. No. 6,337,583.

TECHNICAL FIELD

The present invention relates to a random logic circuit and, more particularly, to a random logic circuit capable of preventing a sub-threshold leak current in sleep mode.

BACKGROUND ART

In recent LSI, it has been intended to reduce operating power source voltage, and to operate the LSI, a technology has been used for lowering threshold voltage of a transistor forming an internal circuit of the LSI.

However, as the sub-threshold leak current is increased in proportion to the lowering of the threshold voltage of the transistor, it is an important problem how to prevent the increase of the sub-threshold leak current.

In semiconductor memory, to reduce the sub-threshold leak current in the internal circuit at the time of standby cycle, a technology called hierarchical power source system has been developed.

FIG. 10 is a diagram showing a hierarchical system. In an internal circuit comprising inverters (X1, X2, X3) connected in series forming a plurality of stages, each inverter comprises a CMOS. As shown in FIG. 10, sources of a PMOS transistor and a NMOS transistor are respectively connected to main power source line L1, sub power source line L2, main grounding line L3 and sub-grounding line L4 corresponding to the condition at the time of stand-by cycle. In this system, at the time of stand-by cycle, a negative potential is applied to a gate, whereby the sub-threshold leak current generated in the internal circuit is reduced.

In MTCMOS circuit, to reduce the sub-threshold leak current in sleep mode, there is a system in which power source of the internal circuit is switched off. In this system, a latch circuit called balloon circuit is connected to the internal circuit, and data inputted to the internal circuit are also inputted to the balloon circuit. In sleep mode, when the power source of the internal circuit is off, the internal circuit and the balloon circuit are disconnected from each other, and the data inputted to the internal circuit disappear. However, as the same data are stored in the balloon circuit, the data can be transferred from the balloon circuit to the internal circuit when the power source is on.

A random logic circuit is hereinafter described.

FIG. 11 is a diagram showing an arrangement of a conventional random logic. Symbol F/F indicates a flip-flop circuit for receiving data from a logic circuit of former stage, holding the data, and outputting the data to a logic circuit of latter stage. In the drawing, reference numerals 200 to 205 indicate buffer circuits, numerals 206 to 211 indicate flip-flop circuits, and numerals 212 to 214 indicate logic circuits. Numerals 215 to 220 indicate flip-flop circuits, numerals 221 to 223 indicate logic circuits, and numerals 224 to 229 indicate flip-flop circuits. Numerals 230 to 232 indicate logic circuits, and numerals 233 to 238 indicate flip-flop circuits. An input signals inputted to the buffer circuits 200 to 205 are respectively inputted to the flip-flop circuits 206 to 211 and held there. The held data are then outputted to the logic circuits 212 to 214 corresponding to the content processed. Results obtained after the processing in the logic circuits 212 to 214 are outputted to the flip-flop circuits 215 to 220 and held there. In this manner, the data processing is performed in order by a logic circuit and a flip-flop circuit connected to the latter stage.

FIG. 12 is a diagram showing an arrangement of the flip-flop circuit shown in FIG. 11. The flip-flop circuit is controlled using complementary two-phase clocks (CKB signal and CK signal) by a control circuit not shown, thus holding and shifting operations of data are performed.

The data from the logic circuit or the buffer circuit of former stage are inputted to an input terminal D and further inputted to a latch portion of former stage through an inverter 239 during activation period of CKB signal (CK signal is inactive). The latch portion of former stage comprises an inverter 240 and an inverter 241.

Then, the data are held in the latch portion of former stage during activation period of CK signal (CKB signal is inactive), transferred to a latch portion of latter stage through an transfer gate 242, and outputted from an output terminal Q through inverters 243 and 245. The latch portion of latter stage comprises the inverter 243 and an inverter 244. During activation period of next CKB signal (while CK signal being inactivated), the data outputted from the transfer gate 242 are held in the latch portion of latter stage.

As described above, as far as semiconductor memory or MTCMOS circuit is concerned, there is a method for preventing sub-threshold leak current occurring at the time of stand-by cycle or in sleep mode. However, a problem exists in that such a method of prevention is not applicable to the random logic memory.

More specifically, in sleep mode, as data held in the flip-flop circuit are varied depending on the content processed in the logic circuit of former stage, the data are not always uniform being different from those held in the semiconductor memory. Even if adopting any hierarchical system in the random logic circuit, there is a problem that generation of the sub-threshold leak current cannot be prevented depending on the content of input data.

There is another problem that in case of providing any balloon circuit, it is necessary to establish a path of data in addition to signal path for normal access, which results in rather complicated control of the internal circuit of the random logic circuit.

DISCLOSURE OF THE INVENTION

Accordingly, the present invention was made to solve the above-discussed problems and has an object of providing a random logic circuit capable of preventing a sub-threshold leak current.

This object and advantages are achieved by providing a new and improved random logic circuit including: an input portion for inputting data; a first latch portion for receiving the data outputted from the input portion, and holding and outputting the data; a second latch portion for receiving the data outputted from the first latch portion, and holding and outputting the data; an output portion for receiving the data outputted from the second latch portion and outputting the data to a logic circuit; and a prevention circuit for preventing generation of a sub-threshold leak current in sleep mode between the first latch portion and the second latch portion.

The above object and novel features of the invention will more fully appear from the following derailed description when the same is read in connection with the accompanying drawing. It is to be expressly understood, however, that the drawing is for purpose of illustration only and is not intended as a definition of the limits of the invention.

BEST MODE FOR CARRYING OUT THE INVENTION

EXAMPLE 1

Figure 1:
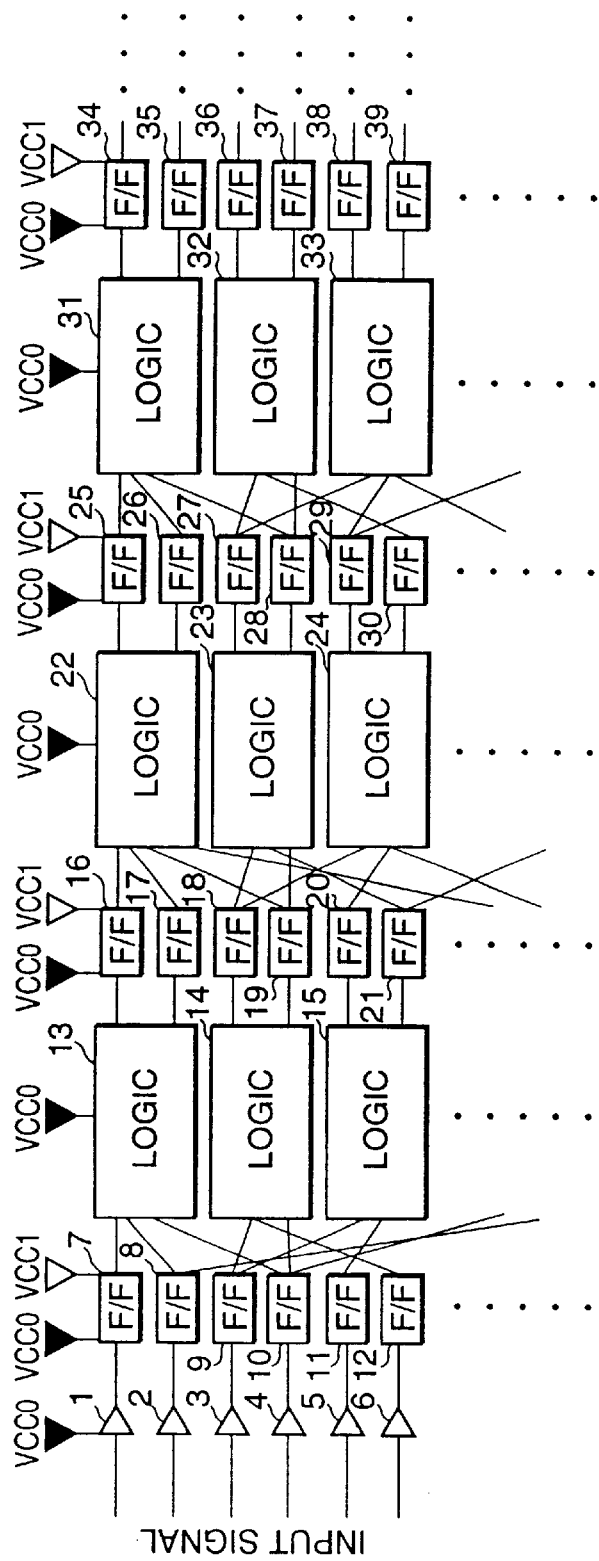
FIG. 1 is a diagram showing an arrangement of a random logic circuit according to example 1 of the present invention.

FIG. 1 is a diagram showing an arrangement of a random logic circuit according to example 1 of the invention. In FIG. 1, symbol F/F indicates a flip-flop circuit. Reference numerals 1 to 6 indicate buffer circuits, numerals 7 to 12 indicate flip-flop circuits, and numerals 13 to 15 indicate logic circuits. Numerals 16 to 21 indicate flip-flop circuits, numerals 22 to 24 indicate logic circuits, numerals 25 to 30 indicate flip-flop circuits, numerals 31 to 33 indicate logic circuits, and numerals 34 to 39 indicate flip-flop circuits.

Input signals (data) from outside of the random logic circuit are processed in order of the buffer circuits 1 to 6, flip-flop circuits 7 to 12, logic circuits 13 to 15, flip-flop circuits 16 to 21, logic circuits 22 to 24, flip-flop circuits 25 to 30, logic circuits 31 to 33, and flip-flop circuits 34 to 39.

The flip-flop circuits hold the data outputted from the buffer circuits or the logic circuits, and output the data to the logic circuits subsequently connected. The flip-flop circuits are connected to the logic circuits necessary for next data processing.

VCC0 indicates a power source which is on in normal mode of the random logic circuit and off in sleep mode. VCC1 indicates a power source which is on both in normal mode and in sleep mode of the random logic circuit.

Though FIG. 1 shows a part of the random logic circuit, other flip-flop circuits and logic circuits are also provided.

Figure 2:
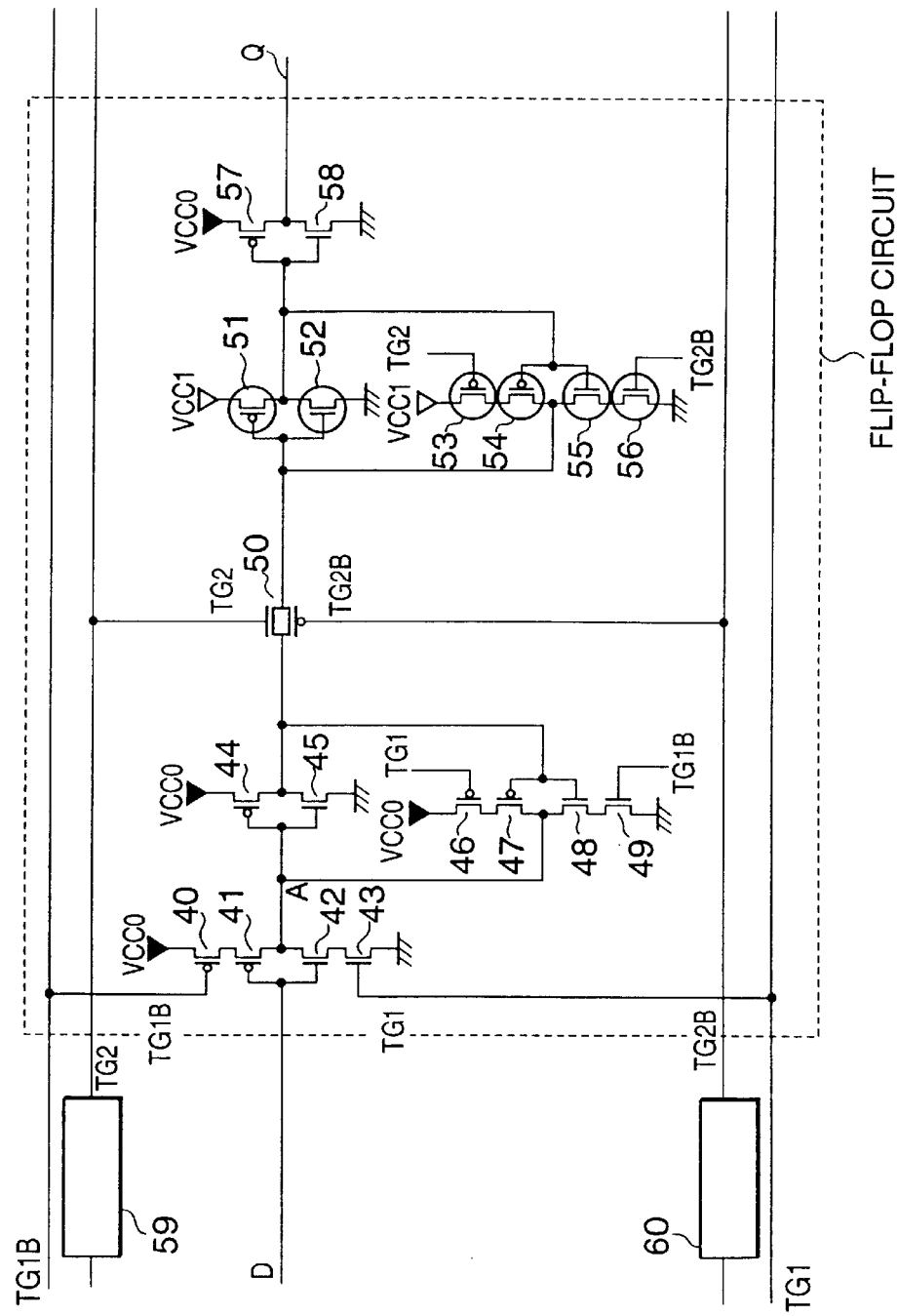
FIG. 2 is a diagram showing an arrangement of flip-flop circuits 7 to 12, 16 to 21, 25 to 30 and 34 to 39 shown in FIG. 1.

FIG. 2 is a diagram showing an arrangement of flip-flop circuits 7 to 12, 16 to 21, 25 to 30 and 34 to 39 shown in FIG. 1. Reference numerals 40 to 41, 44, 46 to 47, 51, 53 to 54, and 57 indicate PMOS transistors respectively, and numerals 42 to 43, 45, 48 to 49, 52, 55 to 56, and 58 indicate NMOS transistors respectively. Each flip-flop circuit comprises an input portion, a latch portion of former stage, a latch portion of latter stage, and an output portion. The input portion comprises an inverter circuit comprising the PMOS transistors 40, 41 and the NMOS transistors 42, 43. The latch portion of former stage comprises an inverter circuit comprising the PMOS transistor 44 and the NMOS transistor 45, and another inverter circuit comprising the PMOS transistors 46, 47 and the NMOS transistors 48, 49. The latch portion of latter stage comprises an inverter circuit comprising the PMOS transistors 51, 52, and another inverter circuit comprising the PMOS transistors 53, 54 and the NMOS transistors 55, 56. The output portion comprises an inverter circuit comprising the PMOS transistor 57 and the NMOS transistor 58.

The latch portion of former stage and the latch portion of latter stage are separated from each other by a transfer gate 50. The transfer gate 50 is controlled by a TG2 signal and a TG2B signal both serving as a control signal.

The TG1 signal and the TG1B signal are signals generated by the control circuit (not shown) synchronizing with a basic clock signal (not shown). The TG1B signal is an inversion signal of the TG1 signal. The TG2 signal and the TG2B signal are signals also generated by the control circuit synchronizing with the basic clock signal. The TG2B signal is an inversion signal of the TG2 signal. Each transistor is controlled by the TG1 signal, TG1B signal, TG2 signal and TG2B signal. The TG1 signal, TG1B signal, TG2 signal and TG2B signal are set to VCC level or VSS level in normal mode.

The control circuit is mounted on the same board as the random logic circuit, and controls the random logic circuit.

Reference numerals 59 and 60 indicate level converter circuits. The level converter circuit 59 is provided in the mentioned control circuit or in the random logic circuit, and in normal mode, outputs the TG2 signal of VCC level or VSS level outputted from the control circuit to the transfer gate 50 and to the latch portion of latter stage. The level converter circuit 60 is also provided in the mentioned control circuit or in the random logic circuit and, in normal mode, outputs the TG2B signal of VSS level or VCC level, which is an inversion signal of the TG2 signal and outputted from the control circuit, to the transfer gate 50 and to the latch portion of latter stage. By turning the transfer gate 50 on, data are transferred from the latch portion of former stage to the latch portion of latter stage.

In normal mode, the level converter circuits 59 and 60 output the TG2 signal and the TG2B signal of the potential as mentioned above to the transfer gate 50 and to the latch portion of latter stage. In sleep mode, the level converter circuit 59 generates a low voltage (a negative voltage) with respect to VSS level, and the level converter circuit 60 generates a high voltage (a positive voltage) with respect to VCC level. In sleep mode, the level converter circuit 59 converts the level of the TG2 signal in accordance with a sleep mode detection signal (not shown) generated in the control circuit.

In sleep mode, the level converter circuit 60 also converts the level of the TG2B signal in accordance with the mentioned sleep mode detection signal. The low voltage and the high voltage to be applied to the transfer gate 50 are supplied from the control circuit or from outside to the level converter circuits 59 and 60, and in sleep mode, the low voltage and the high voltage are selected and outputted by the sleep mode detection signal. In sleep mode, a gate of the transfer gate 50 is supplied with a voltage such that a voltage between the gate and a source of the transfer gate 50 has a polarity different from a polarity for turning on the transfer gate 50.

The sleep mode means that when data are not inputted to the random logic circuit for a certain time, to reduce power consumption of the random logic circuit, the mentioned control circuit generates the sleep mode detection signal to put the random logic circuit into a condition of stand-by. The control circuit can count a certain time by using a timer circuit. The power source VCC0 is supplied from the control circuit, and in sleep mode turned off by the control circuit. The power source VCC1 is also supplied from the control circuit.

In normal mode, the TG1B signal is on VSS level, and the TG1 signal is on VCC level. Data are inputted to the input portion, and further inputted to the latch portion of former stage. At this time, the TG2B signal is on VCC level, and the TG2 signal is on VSS level.

Then, the TG2B signal comes to VSS level, the TG2 signal comes to VCC level, TG1B signal comes to VCC level, and the TG1 signal comes to VSS level. As a result, the data are held in the latch portion of former stage, then the data is inputted to the latch portion of latter stage through the transfer gate 50. The data inputted to the latch portion of latter stage are outputted through the output portion.

In the subsequent cycle, the TG2B signal comes to VCC level, the TG2 signal comes to VSS level, and the data inputted to the latch portion of latter stage are held. The TG1B signal is on VSS level, and the TG1 signal is on VCC level.

In sleep mode, the power source VCC0 supplied to the input portion, latch portion of former stage and output portion is off. Data are held by the latch portion of latter stage in sleep mode.

The low voltage with respect to VSS level is generated by the level converter circuit 59, the high voltage with respect to VCC level is generated by the level converter circuit 60, and the low voltage and the high voltage are applied to the transfer gate 50. As each voltage is applied to the NMOS transistors and PMOS transistors of the transfer gate 50, it becomes possible to prevent generation of the sub-threshold leak current between the latch portion of former stage and the latch portion of latter stage.

To get out of the sleep mode, just turning on the power source VCC0 being off by the control circuit is sufficient, whereby it becomes possible to continue the operation before the sleep mode.

In addition, in the transfer gate 50, a low threshold potential is used so as to be operable in a low power source voltage.

In each transistor of the latch portion of latter stage, to prevent the sub-threshold leak current and to hold the random information exactly, a high threshold potential is used as compared with the transistors in the input portion, latch portion of former stage, transfer gate 50 and output portion.

As described above, in the random logic circuit according to example 1 of the invention, generation of the sub-threshold leak current in respective transistors can be prevented by turning off the power source VCC0 in sleep mode.

Further, without adding any balloon circuit, just by applying the low voltage and the high voltage to each gate of the transfer gate 50 in sleep mode, data can be exactly held in the latch portion of latter stage. Furthermore, generation of the sub-threshold leak current between the latch portion of latter stage holding the data and the latch portion of former stage of which power source is turned off can be prevented.

EXAMPLE 2

Figure 3:
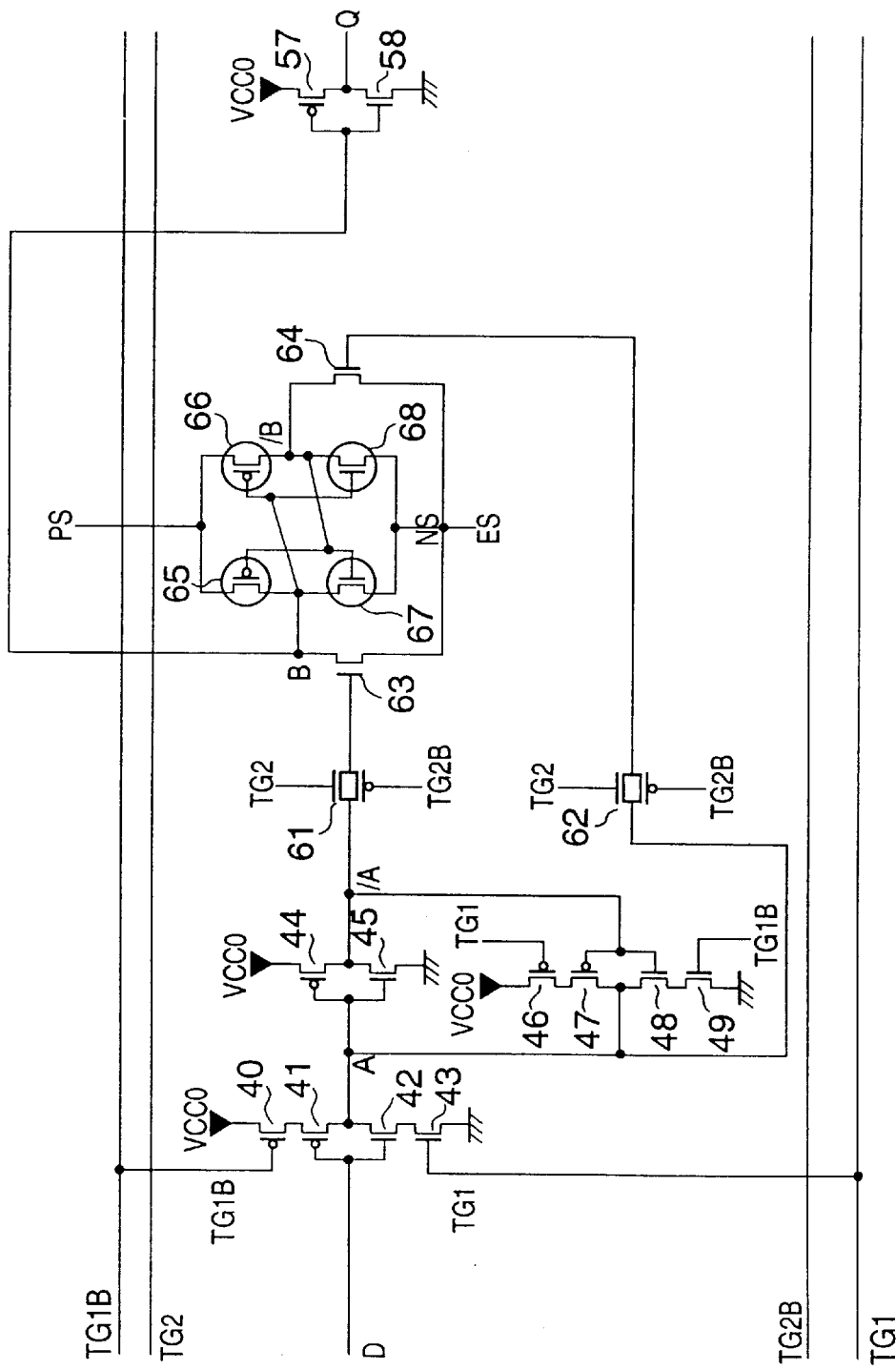
FIG. 3 is a diagram showing an arrangement of flip-flop circuits according to example 2 of the invention.

FIG. 3 is a diagram showing an arrangement of a flip-flop circuit according to example 2 of the invention. This arrangement differs from example 1 in the aspect that the latch portion of latter stage comprises a differential amplifier, and that any conversion of potential of the TG2 signal and the TG2B signal by the level converter circuit is not performed.

Reference numerals 61 and 62 indicate transfer gates which are turned on or off by the TG2 signal and the TG2B signal. Numerals 63 and 64 are NMOS transistors in which complementary signals /A and A inputted through the transfer gates 61 and 62 are applied to respective gates. Numerals 65 and 66 are PMOS transistors, and numerals 67 and 68 are NMOS transistors. The differential amplifier comprises these transistors 65 to 68. The differential amplifier serves as the latch portion of latter stage.

In sleep mode, as VCC0 is turned off in the input portion, latch portion of former stage and output portion, any sub-threshold leak current is not generated in the internal circuit system. However, as an electric field is applied only to the latch portion of latter stage, and elements thereof comprises the transistors 65 to 68 in which generation of the sub-threshold leak current is small (such as transistors of high threshold potential or SOI transistors).

In the same manner as example 1, the input portion comprises transistors 40 to 43, and the latch portion of former stage comprises transistors 44 to 49. Further, the output portion comprises transistors 57 and 58. In this example 2, each gate of the transistors 57 and 58 is connected to the drain side of the transistor 63.

Data from outside are transferred to an input terminal D, input portion, latch portion of former stage, latch portion of latter stage and output portion, and outputted from an output terminal Q to the subsequent logic circuit. The data inputted to the input terminal D data are outputted to the input portion and the latch portion of former stage after the TG1 signal comes to VCC level and the TG1B signal comes to VSS level (the TG2 signal comes to VSS level and the TG2B signal comes to VCC level). Then, the TG2 signal comes to VCC level and the TG2B signal comes to VSS level (the TG1 signal comes to VSS level and the TG1B signal comes to VCC level), and the data are held in the latch portion of former stage. At the same time, the transfer gates 61 and 62 are turned on, and the data are inputted to the latch portion of latter stage. The data A outputted from the input portion are inversion signal of the data inputted to the input terminal D. The data A are applied to the gate of the transistor 64 through the transfer gate 62. The data /A are inversion signal of the data A, and applied to the gate of the transistor 63 through the transfer gate 61.

Then, operation of the latch portion of latter stage in normal mode and in sleep mode of the random logic circuit is hereinafter described.

Figure 4:
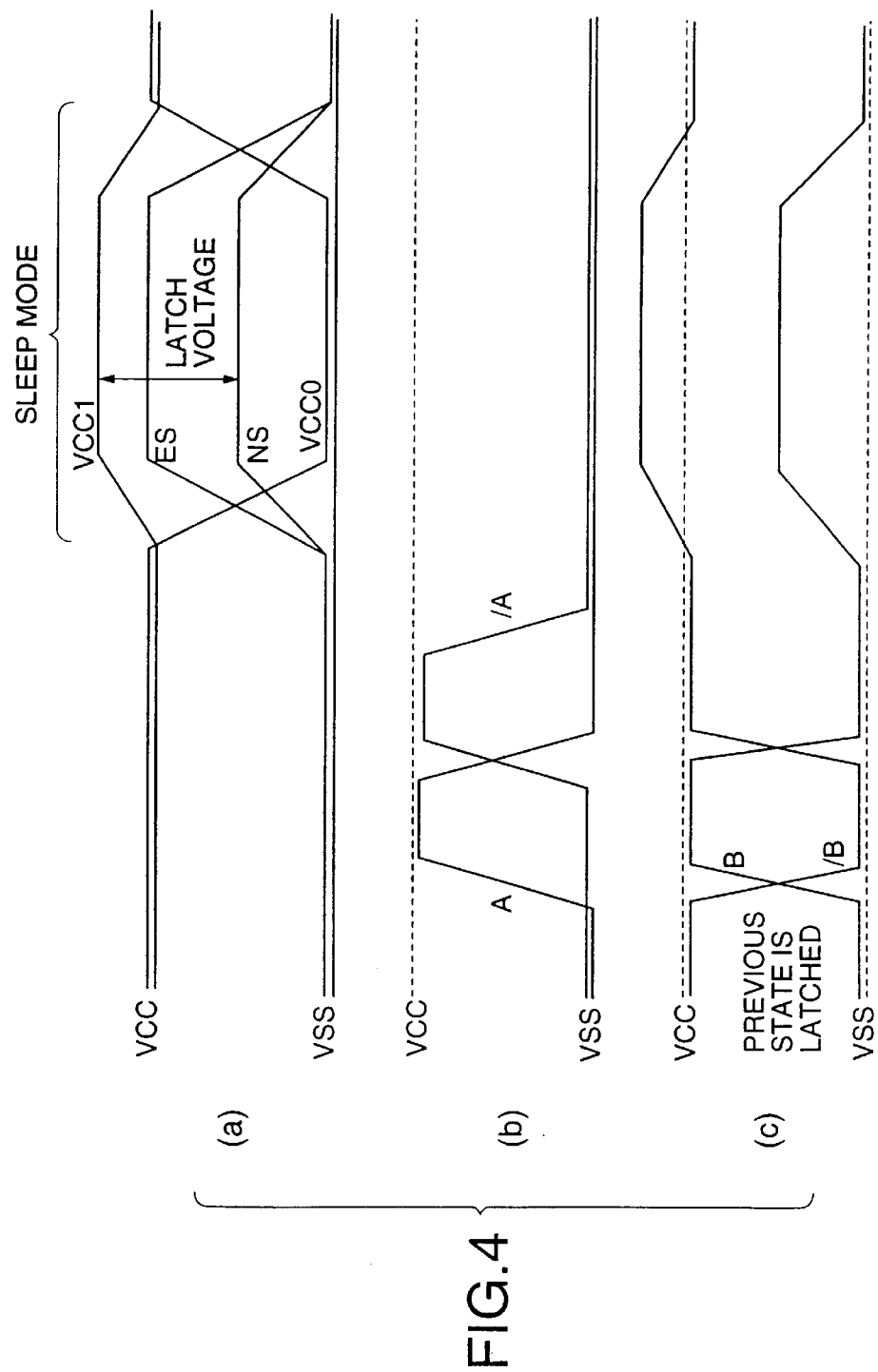
FIG. 4 is a timing chart showing an operation of a latch portion of latter stage.

FIG. 4 is a timing chart showing the operation of the latch portion of latter stage.

First, operation in normal mode is described.

ES signal and NS signal are supplied with VSS level. However, drive force of the NMOS transistors 67 and 68 is small due to a high threshold potential. Therefore, the NMOS transistors 63 and 64 receiving the data from the latch portion of former stage determines polarity of the latch portion of latter stage. The NS signal as a common source potential is supplied to the NMOS transistors 67 and 68. The ES signal as a common source potential is supplied to the NMOS transistors 63 and 64. As the PS signal is on VCC level, the latch portion of latter stage generates the data and outputs them through a latch operation determined between VCC level potential and VSS level potential.

Then, the TG2 signal comes to VCC level and the TG2B signal comes to VSS level (the TG1 signal comes to VSS level and the TG1B signal comes to VCC level), and the transfer gates 61 and 62 are turned on. The data A are applied to the gate of the transistor 64, and the data /A are applied to the gate of the transistor 63.

As shown in FIG. 4, when the data A is on VCC level and the data /A is on VSS level, the transistor 63 is off, and the transistor 64 is on. Data B (on the drain side of the transistor 63) is on VCC level, and data /B (on the drain side of the transistor 64) is on VSS level. The data B (VCC level) is inverted in the output portion, and an output signal of VSS level is outputted.

Then, the sleep mode is hereinafter described.

The VCC0 supplied to the input portion, latch portion of former stage and output portion is turned off. In the same manner as example 1, the TG1 signal, the TG1B signal, the TG2 signal and the TG2B signal from the control circuit are also off.

In sleep mode, holding operation of data is performed in the latch portion of latter stage in the same manner as example 1. As shown in FIG. 4, a sleep mode when data A is on VSS level, data /A is on VCC level, data B is on VSS level and data /B is on VCC level is hereinafter described. At this time, the transistors 66 and 67 are on, and the transistors 65 and 68 are off.

The transfer gates 61 and 62 are not supplied with the TG2 signal and the TG2B signal from the control circuit, and are off respectively.

VCC level is applied to the gate of the transistor 63. In the transfer gate 61, a sub-threshold leak current is generated because of characteristic of the device, and the sub-threshold leak current is generated from the gate of the transistor 63 to the latch portion of former stage. Because of the influence by the sub-threshold leak current, the gate of the transistor 63 is lowered to VSS level. The sub-threshold leak current flows from the drain side of the transistor 63 to the source side (ES terminal side). The NS terminal and the ES terminal are both on VSS level in this stage.

To reduce the sub-threshold leak current, voltage on the source side of the transistor 63 is set to be higher than the gate voltage (VSS). Voltage of the ES terminal is increased to VCC level.

Further, as a sub-threshold leak current from the source side to the drain side of the transistor 63 is also generated, voltage of the NS terminal is set to be higher than the gate voltage (VSS). For example, by setting a minimum voltage enough to secure a latch voltage, i.e., by setting a voltage between a potential higher than VSS and VCC, the drain voltage becomes higher than the gate voltage, whereby the sub-threshold leak current is reduced.

Voltage of the PS terminal is also set to a VCC1 level higher than VCC to secure the latch voltage in accordance with the voltage-of the NS terminal of which voltage has been increased.

In addition, even if the level of the data A and the data /A is in the reverse order, by controlling likewise the voltage of the NS terminal, the ES terminal and the PS terminal, the sub-threshold leak current of the transistor 64 is reduced.

To get out of the sleep mode, just by turning on the source voltage VCC0 being off, it becomes possible to perform a circuit operation in succession to that before the sleep mode.

Figure 5:
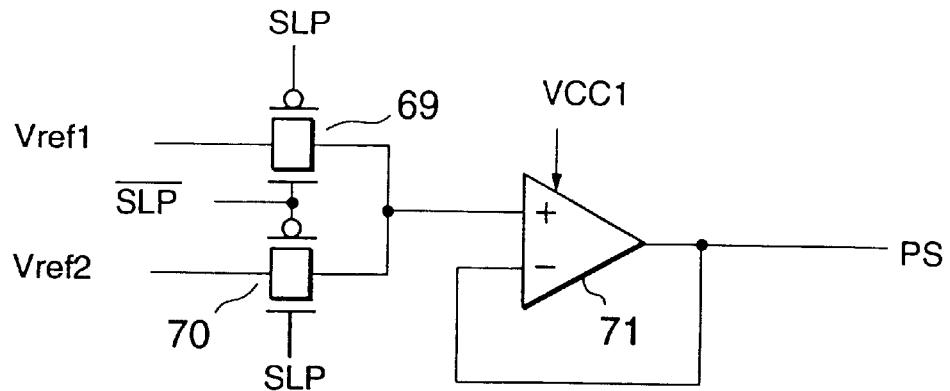
FIG. 5 is a diagram showing an arrangement of a voltage control circuit for controlling a voltage of PS terminal.

FIG. 5 is a diagram showing an arrangement of a voltage control circuit for controlling the voltage of the PS terminal. Reference numerals 69 and 70 indicate transfer gates, and numeral 71 indicates an operational amplifier circuit. In accordance with the sleep mode detection signal (SLP signal and /SLP signal) from the control circuit described in example 1, either a preset voltage Vref1 or Vref2 is supplied to the PS terminal. The Vref1 is on VCC level, and the Vref2 is on VCC1 level.

Figure 6:
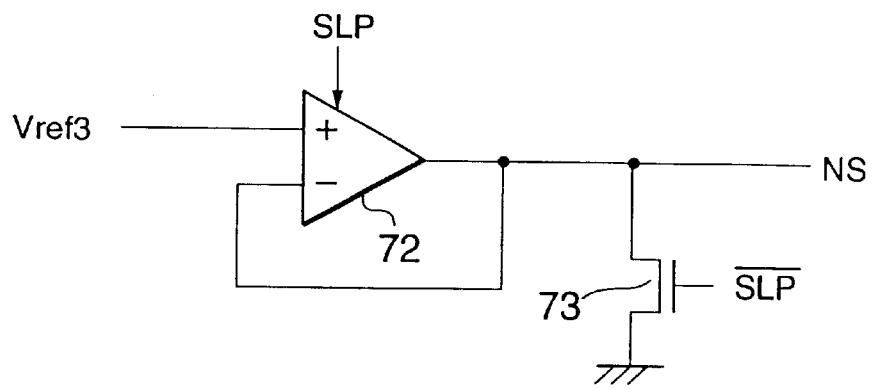
FIG. 6 is a diagram showing an arrangement of a voltage control circuit for controlling a voltage of NS terminal.

FIG. 6 is a diagram showing an arrangement of a voltage control circuit for controlling the voltage of the NS terminal. Reference numeral 72 indicates an operational amplifier, and numeral 73 indicates a NMOS transistor. In the NOMOS transistor 73, the /SLP signal which is an inversion signal of the SLP signal is applied to the gate. In normal mode, VSS level is supplied to the NS terminal, and in sleep mode, a preset voltage Vref3 is supplied to the NS terminal.

Figure 7:
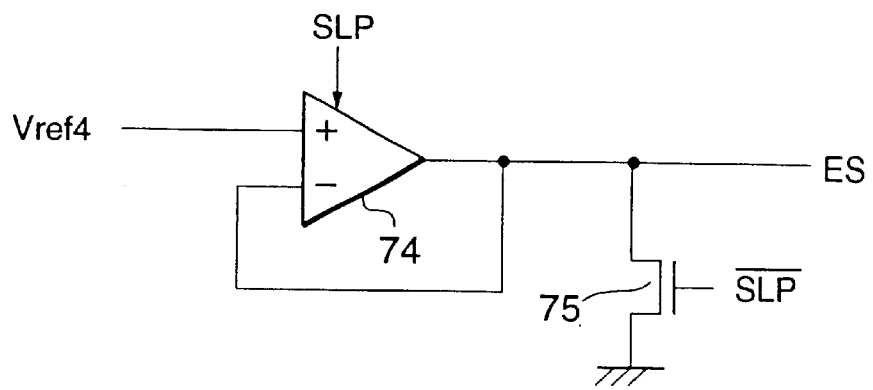
FIG. 7 is a diagram showing an arrangement of a voltage control circuit for controlling a voltage of ES terminal.

FIG. 7 is a diagram showing an arrangement of a voltage control circuit for controlling the voltage of the ES terminal. Reference numeral 74 indicates an operational amplifier, and numeral 75 indicates a NMOS transistor. In the NOMOS transistor 75, the /SLP signal which is an inversion signal of the SLP signal is applied to the gate. In normal mode, VSS level is supplied to the ES terminal, and in sleep mode, a preset voltage Vref4 is supplied to the ES terminal.

Each voltage control circuit is provided in the control circuit or in the random logic circuit.

As described above, in this example 2, the latch portion of latter stage is arranged such that the data A and data/A from the latch portion of former stage are received by respective gates of the transistors 64 and 63. As a result, in sleep mode, generation of the sub-threshold leak current between the latch portion of latter stage and the latch portion of former stage of which power source is turned off can be prevented.

Further, without adding any balloon circuit, just by setting the voltage of the NS terminal and that of the ES terminal to a certain high potential in sleep mode, the data are exactly held in the latch portion of latter stage. Moreover, generation of the sub-threshold leak current of the transistors 63 and 64 can be prevented.

Furthermore, by turning off the power source VCC0 of the input portion, latch portion of former stage and output portion in sleep mode, generation of the sub-threshold leak current in respective transistors can be prevented.

EXAMPLE 3

Figure 8:
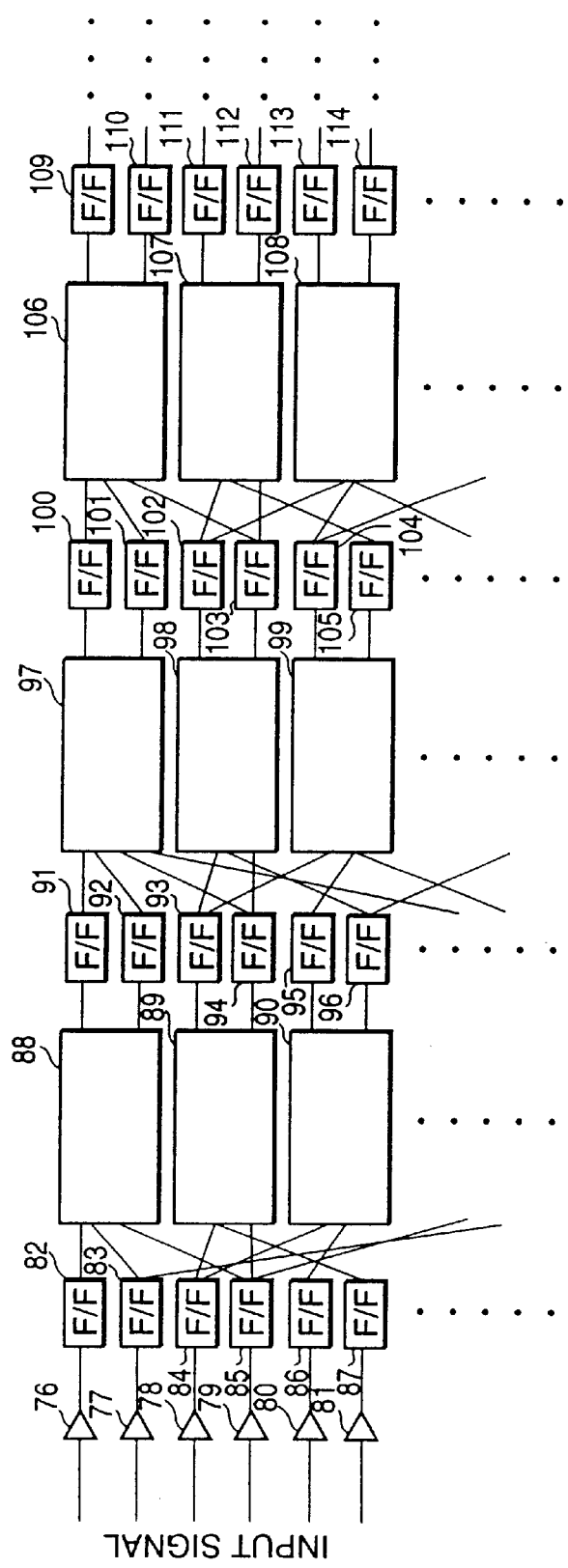
FIG. 8 is a diagram showing an arrangement of a random logic circuit according to example 3 of the invention.

FIG. 8 is a diagram showing an arrangement of a random logic circuit according to example 3 of the invention. In the drawing, reference numerals 76 to 81 indicate buffer circuits, and numerals 82 to 87, 91 to 96, 100 to 105, and 109 to 114 indicate flip-flop circuits. Each flip-flop circuit is indicated by F/F. Numerals 88 to 90, 97 to 99, and 106 to 108 indicate pass transistor logic circuits. Input signals (data) from outside are processed in order of the buffer circuits 76 to 81, flip-flop circuits 82 to 87, pass transistor logic circuits 88 to 90, flip-flop circuits 91 to 96, pass transistor logic circuits 97 to 99, flip-flop circuits 100 to 105, pass transistor logic circuits 106 to 108, and flip-flop circuits 109 to 114. Each flip-flop circuit holds the input data and outputs them to each pass transistor logic circuit subsequently connected. As shown in the drawing, each flip-flop circuit is connected to the pass transistor logic circuit necessary for the subsequent data processing.

Figure 9:
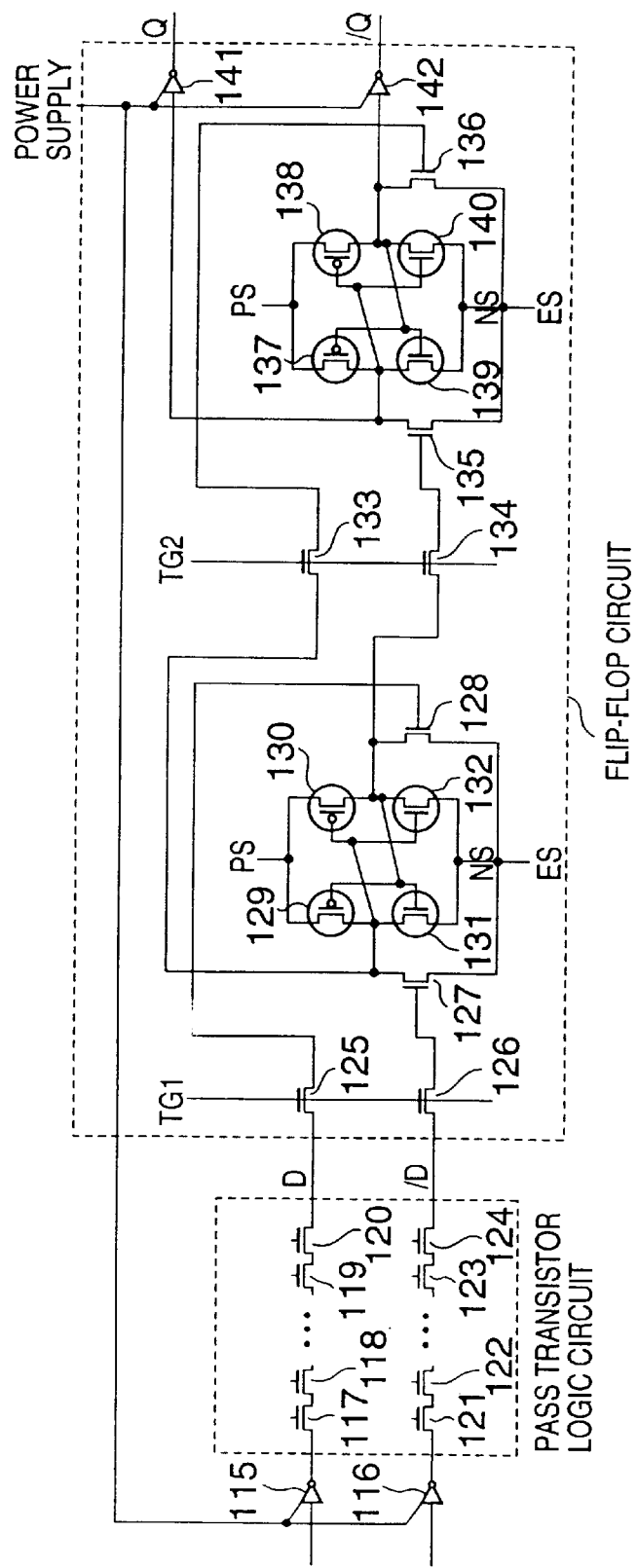
FIG. 9 is a diagram showing an arrangement of a pass transistor logic circuit and a flip-flop circuit shown in FIG. 8.
Figure 10:
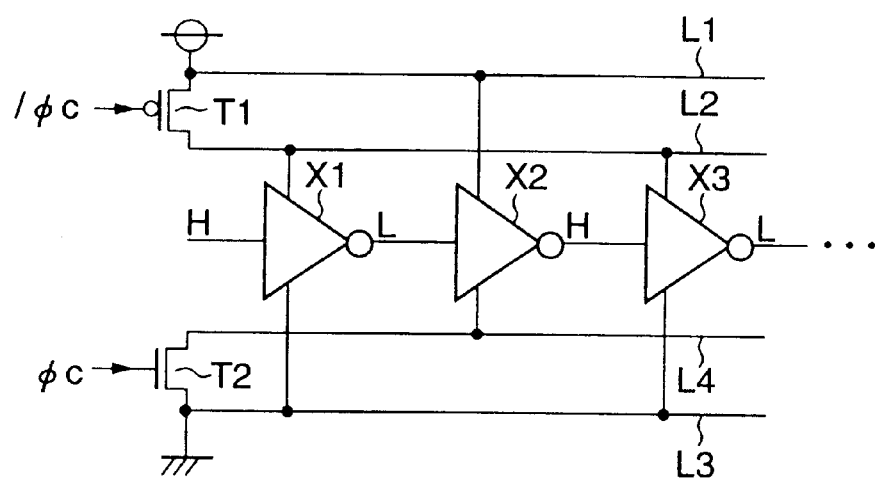
FIG. 10 is a diagram showing a hierarchical system according to the prior art.
Figure 11:
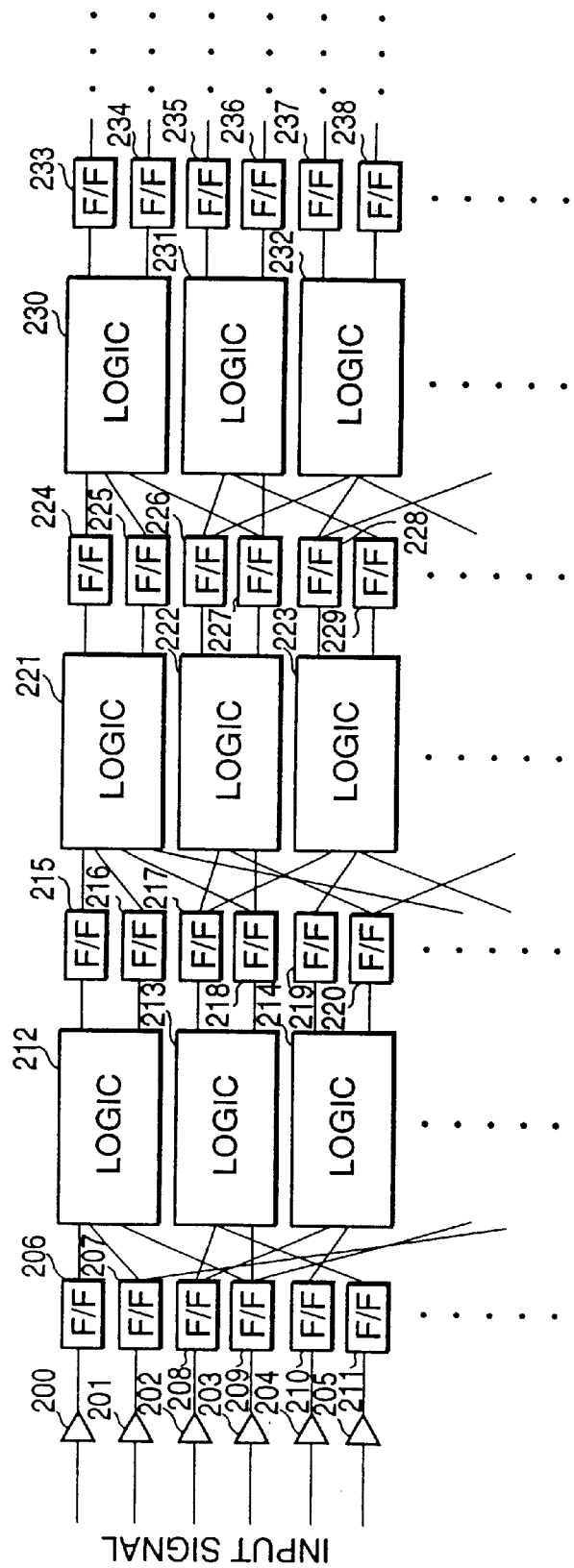
FIG. 11 is a diagram showing an arrangement of a random logic circuit according to the prior art.
Figure 12:
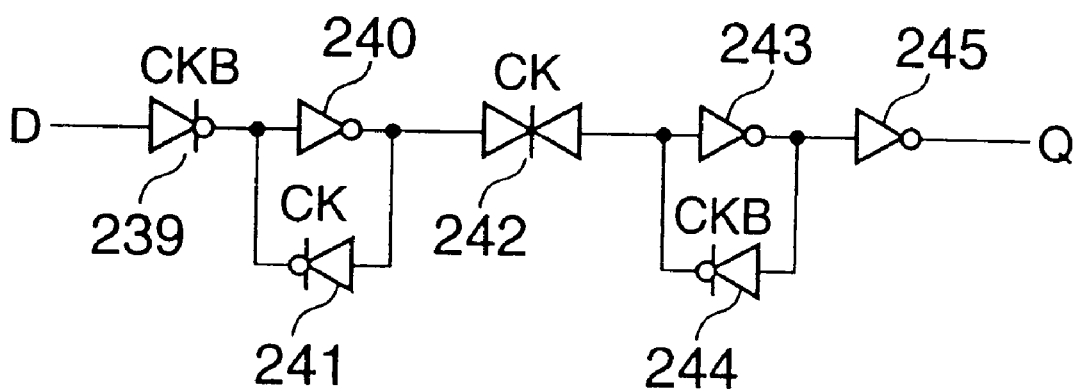
FIG. 12 is a diagram showing an arrangement of flip-flop circuits shown in FIG. 11.

FIG. 9 is a diagram showing an arrangement of a pass transistor logic circuit and a flip-flop circuit shown in FIG. 8. In this example 3, being different from the circuit arrangement according to the foregoing example 1 and example 2, a pass transistor logic circuit is used and, moreover, the latch portion of former stage of the flip-flop circuit comprises a differential amplifier. The pass transistor logic circuit is used to achieve a high speed processing and comprises NMOS transistors.

In FIG. 9, reference numerals 115 to 116 indicate inverter circuits, numerals 117 to 124 indicate NMOS transistors forming the pass transistor logic circuit, numerals 125 to 126 indicate NMOS transistors controlled by TG1 signal, and numerals 127 to 128 indicates NMOS transistors. Numerals 129 to 130 indicate PMOS transistors, numerals 131 to 132 indicate NMOS transistors, numerals 133 to 134 indicate NMOS transistors controlled by TG2 signal, and numerals 135 to 136 indicate NMOS transistors. Numerals 137 to 138 indicate PMOS transistors, numerals 139 to 140 indicate NMOS transistors, and numerals 141 to 142 indicate inverter circuits.

Operation in normal mode is hereinafter described.

The pass transistor logic circuit receives complementary data through the inverter circuits 115 and 116. Respective data pass through the pass transistor logic circuit comprising the NMOS transistors 117 to 124, and are outputted in the form of data D and data /D. When the TG1 signal is on VCC level (the TG2 signal is on VSS level), the NMOS transistors 125 and 126 are turned on. Thus, the data D are applied to the gate of the NMOS transistor 128, and the data /D are applied to the gate of the NMOS transistor 127. Operation of the differential amplifier of the latch portion of former stage is same as that of the differential amplifier according to example 2. The data held in the latch portion of former stage are applied to each gate of the NMOS transistors 135 and 136 through the NMOS transistors 133 and 134, as complementary data, when the TG2 signal is on VCC level (the TG1 signal is on VSS level) Operation of the differential amplifier of the latch portion of latter stage is same as that of the differential amplifier according to example 2. The data held in the latch portion of latter stage are applied to the subsequent pass transistor logic circuit through the inverter circuits 141 and 142, as complementary data (Q and /Q). The TG1 signal and the TG2 signal are complementary signals. By controlling these signals, operations including input of the data to the latch portion of former stage, holding of the data, input of the data from the latch portion of former stage to the latch portion of latter stage, holding of the data, and output of the data, are performed. TG1 signal and TG2 signal are generated by the control circuit in the same manner as in the foregoing examples 1 and 2.

Then, operation in sleep mode is hereinafter described.

The pass transistor logic circuit, TG1 signal and TG2 signal are turned off by the control circuit. The NMOS transistors 125, 126, 133 and 134 are respectively turned off as a result of turning off the TG1 signal and TG2 signal. The data are held in the latch portion of former stage and in the latch portion of latter stage, respectively. In the same manner as in example 2, voltage in the NS terminal, ES terminal and PS terminal is increased to be higher than the voltage in normal mode by each voltage control circuit shown in FIGS. 5 to 7.

As described above, in the random logic circuit according to example 3, since respective data from the pass transistor logic circuit are received by each gate of the transistors 127 and 128 of the latch portion of former stage, generation of the sub-threshold leak current in sleep mode between the latch portion of former stage and the pass transistor logic circuit can be prevented.

Further, since respective data from the latch portion of former stage are received by each gate of the transistors 135 and 136 of the latch portion of latter stage, generation of the sub-threshold leak current in sleep mode between the latch portion of former stage and the latch portion of latter stage can be prevented.

In sleep mode, by increasing the potential of the ES terminal and the NS terminal, generation of the sub-threshold leak current in the transistors 127, 128, 135 and 136 can be prevented.

Since the generation of the sub-threshold leak current in sleep mode between the latch portion of former stage and the pass transistor logic circuit can be prevented as described above, it becomes possible to largely lower the threshold voltage of the pass transistor logic circuit, eventually resulting in improvement of processing performance of the random logic circuit.

Since the pass transistor logic circuit is arranged such that the NMOS transistors are continuously connected, a signal of low drive force is outputted from the output terminal thereof to the latch portion of former stage, and the signal is then amplified sufficiently by the latch portion of former stage. As a result, exact data can be transferred to the latch portion of latter stage.

As has been described so far, according to the invention, in sleep mode, by providing a prevention circuit for preventing sub-threshold leak current, without addition of any balloon circuit, data are exactly held in a second latch portion. And generation of the sub-threshold leak current between a first latch portion with its power source turned off and the second latch portion can be prevented.

In sleep mode, since a power source supplied to an input portion, the first latch portion and an output portion is turned off, generation of the sub-threshold leak current in these portions can be prevented.

In sleep mode, by controlling the voltage of each terminal of a second transistor or a third transistor connected between a first differential amplifier and the first latch portion, generation of the sub-threshold leak current in the second transistor or in the third transistor can be prevented.

By forming the input portion comprising a pass transistor logic circuit, by forming the first latch portion comprising a second differential amplifier, and by connecting a fourth transistor or a fifth transistor between the pass transistor logic circuit and the second differential amplifier, in sleep mode, data are exactly held also in the second differential amplifier. And generation of the sub-threshold leak current between the second differential amplifier and the pass transistor logic circuit can be prevented.

In sleep mode, by controlling the voltage of each terminal of the fourth transistor or the fifth transistor, generation of the sub-threshold leak current in the fourth transistor or in the fifth transistor can be prevented.

Since the threshold voltage of the pass transistor logic circuit can be reduced to be smaller than that in the prior art, it becomes possible to improve the processing performance of the random logic circuit.

What is claimed is:

1. A latch circuit comprising:
    a latch portion having a pair of first conductive type transistors for receiving, holding and outputting data; and
    an impedance changing element connected to an input node of the latch portion to be varied in impedance depending on an input voltage; wherein
    a first voltage is supplied to the input node through the impedance changing element, and a second voltage is supplied to each of the sources of the one pair of first conductive type transistors;

the first voltage and the second voltage, in a first mode excluding a normal mode, being set higher in potential than the input voltage to the impedance changing element.

2. The latch circuit according to claim 1, wherein the first voltage and the second voltage, in the normal mode, are set at the same voltage.

3. The latch circuit according to claim 1, wherein the latch portion is constituted to input complementary data to each of the impedance changing elements respectively connected to a pair of input nodes of the latch portion, to form a cross-couple with the one pair of first conductive type transistors, and to input an output of the impedance changing element to a gate of the cross couple.

4. The latch circuit according to claim 1, wherein the impedance changing element is constituted by a MOS transistor to input a voltage corresponding to data to a gate of the MOS transistor.

5. The latch circuit according to claim 1, wherein the latch portion further comprises a pair of second conductive type transistors, and a third voltage is supplied to each of sources of the one pair of second conductive type transistors;

the third voltage being set to change synchronously with a signal corresponding to the first mode.

6. The latch circuit according to claim 5, wherein the second voltage and the third voltage are set to change synchronously with the signal corresponding to the first mode, and change in a same direction.

7. The latch circuit according to claim 1, wherein a fourth voltage is supplied to one source of a circuit element positioned in a forward stage to the latch portion and a fifth voltage to the other source of the circuit element, the fourth voltage and the fifth voltage being set at a same voltage in the first mode.

* * * * *